INVENTOR
JAMES A. AMICK
BY
W. S. Hill
AGENT

INVENTOR
JAMES A. AMICK
BY
W. S. Hill
AGENT

United States Patent Office 3,354,354

Patented Nov. 21, 1967

3,354,354

OXIDE BONDED SEMICONDUCTOR WAFER UTILIZING INTRINSIC AND DEGENERATE MATERIAL

James A. Amick, Princeton, N.J., assignor to Radio Corporation of America, a corporation of Delaware Filed Mar. 24, 1964, Ser. No. 354,240
2 Claims. (Cl. 317—101)

This invention relates to an improved, composite semiconductor wafer of the type especially useful in integrated electronic circuits.

It has been proposed to use composite glass-semiconductor wafers for certain electronic components in integrated electronic circuits. These prior art, composite wafers comprise a plurality of pieces of semiconductor material insulated from each other by glass. It has also been proposed to make composite, insulator-semiconductor wafers comprising a plurality of pieces of semiconductor material separated from, and insulated from, each other by silicon dioxide.

It is an object of the present invention to provide composite semiconductor wafers on which certain passive components may be more readily and easily formed than heretofore.

Another object of the invention is to provide an improved composite wafer, the active and passive components of which may be more easily interconnected than heretofore.

An object of the present invention is to provide an improved, composite semiconductor wafer useful in integrated electronic circuits, to reduce parasitic interactions, excessive current leakages, and spurious signals.

Still another object of the present invention is to provide an improved, composite silicon dioxide-silicon wafer that can withstand the relatively high temperatures used to diffuse certain elements into silicon in the process of forming active and passive components therein, and that can withstand the temperatures and environments used to prepare these components by certain techniques, such as by epitaxial growth.

Another object of the present invention is to provide an improved semiconductor wafer which includes areas of degenerate semiconductor material arranged in a manner especially suitable for engaging interconnecting means to external circuits.

A further object of the present invention is to provide an improved, composite semiconductor wafer with areas of relatively very high resistivity for supporting certain passive components thereon, areas of relatively very high conductivity that may function as electrical interconnecting means for both certain active and passive components on the wafer, and areas of N-type and/or P-type semiconductor material, all of said areas having substantially the same coefficient of expansion.

Still a further object of the present invention is to provide an improved composite semiconductor wafer suitable for the fabrication of complementary integrated circuits requiring semiconductor material of different conductivity types.

Another object of the present invention is to provide an improved, composite semiconductor wafer of the type described that is relatively simple in construction, easy to adapt for integrated electronic circuits, and highly efficient in use.

Briefly stated, the improved composite wafer of the present invention comprises a wafer-like structure of a plurality of pieces of P-type or N-type semiconductor material, or both P-type and N-type semiconductor material, as well as one or more pieces of substantially intrinsic and/or degenerate semiconductor material electrically insulated from each other by, and bonded together by, an oxide that may be the oxide of the semiconductor material. In one form of the invention, the improved composite wafer comprises a plurality of discrete strips of P-type, N-type, intrinsic, and degenerate silicon bonded to each other by fused silicon dioxide. In another form of the invention, the improved composite wafer comprises a plurality of discrete pieces of P-type, N-type, intrinsic, and degenerate silicon, insulated from each other and held together in a somewhat checkerboard-like structure by fused silicon dioxide. The intrinsic silicon, being of relatively very high resistivity, provides an excellent support for certain passive components of the integrated circuit; and the degenerate silicon, being of relatively high conductivity, provides interconnecting means for both certain passive and active components of the integrated circuits on the composite wafer. The pieces of degenerate silicon may also be disposed in a manner to provide convenient interconnecting means between the composite wafer and external circuits.

The novel features of the present invention, both as to its organization and method of operation, as well as additional objects and advantages thereof, will be more readily understood from the following description, when read in connection with the accompanying drawings, in which similar reference characters represent similar parts throughout, and in which.

Figure 1:
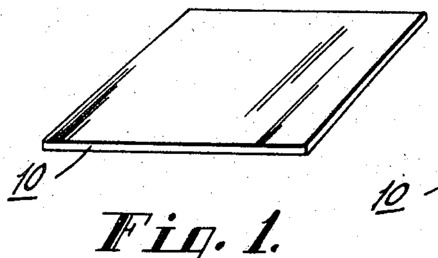
FIG. 1 is a perspective view of a sheet of semiconductor material used in the manufacture of composite wafers of the present invention.

Referring, now, particularly to FIG. 1, there is shown a sheet 10 of semiconductor material, such as silicon or germanium. The sheet 10 is preferably of rectangular shape and is cut from a single crystal. The sheet 10 may be either N-type or P-type silicon, for example. The sheet 10 may also be intrinsic silicon, that is, substantially pure silicon, having a relatively very high electrical resistivity and comprising a good insulating substrate on which to mount passive components, such as resistors, for example.

In addition to the aforementioned materials, the sheet 10 may also be degenerate semiconductor material such as heavily doped silicon, having a relatively high electrical conductivity and providing suitable electrical interconnecting means for certain passive and active components in an integrated electronic circuit.

Figure 2:
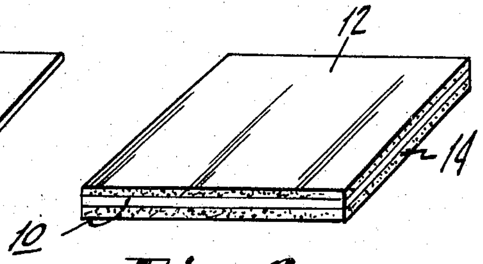
FIG. 2 is a perspective view of a sheet of semiconductor material whose opposed major surfaces have been oxidized.

An electrically insulating and physically binding oxide is deposited or formed on the two major surfaces, which, as viewed in either FIGS. 1 or 2, are the upper and lower surfaces of the sheet 10, by any suitable method known in the art. For example, the sheet 10 of silicon may be oxidized by heating it in steam containing air and/or pure oxygen, to a temperature between 1200° C. and 1250° C. until the major surfaces of the sheet 10 are covered with upper and lower oxide layers 12 and 14, respectively, of a desired thickness, as shown in FIG. 2, for example. Where the sheet 10 is silicon, the oxide layers 12 and 14 are silicon dioxide. A suitable oxide may also be formed on the sheet 10 by heating it in steam containing silicon tetrachloride, or in a hydrogen carrier containing silicon tetrachloride and carbon dioxide, in a manner known in the art. Suitable oxides may also be formed on the sheet 10 by the decomposition of organic oxysilane compounds by known techniques. The oxide coated sheet 10 in FIG. 2 is shown with its peripheral edges trimmed so that the silicon sheet can be seen plainly between the upper and lower oxide layers 12 and 14. However, it is not necessary that the peripheral edges of the sheet 10 be trimmed.

A plurality of oxidized sheets 10 are superimposed on each other to form a stack 16. The number of oxidized sheets 10 in any stack 16 will depend upon the size of the ultimate composition wafer desired. In the stack 16, shown in FIG. 3, nine sheets 10 of semiconductor material of different types are superimposed on each other to form the stack 16. The sheets 10 designated as D and I are of degenerate and intrinsic semiconductor material, respectively, preferably silicon. The sheets designated as P and N are of P-type and N-type (doped) semiconductor material, respectively, preferably silicon also.

Figures 3, 11, 12:
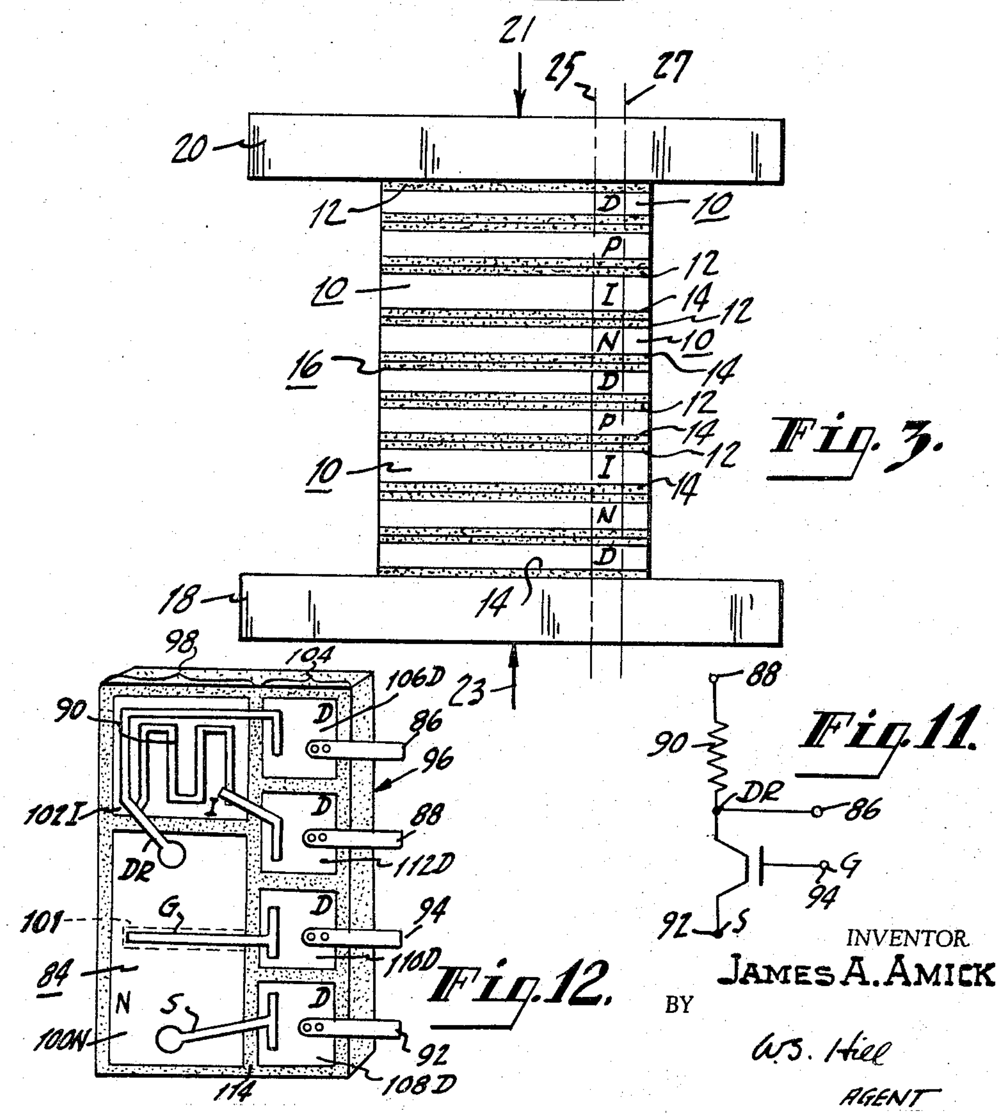
FIG. 3 is a front elevational view of a stack of oxidized sheets of semiconductor material under pressure in one of the steps in the method of making composite wafers of the present invention.
FIG. 11 is a schematic drawing of a metal oxide semiconductor (MOS) transistor amplifier circuit.
FIG. 12 is a perspective view of a composite wafer of the present invention having the active and passive components illustrated by the schematic drawing of FIG. 11.

The stack 16 is placed between blocks 18 and 20 of graphite to prevent scratching of the lower oxide layer 14 and the upper oxide layer 12 of the lowermost and uppermost sheets 10, respectively, and the entire assembly is placed in a press (not shown) wherein the stack 16 is compressed by forces in the directions normal to the major surfaces, as indicated by the arrows 21 and 23 in FIG. 3. Depending upon the oxide and the material of the sheets 10, the pressure applied between the blocks 18 and 20 may be from about 100 p.s.i. to about 2,000 p.s.i. While pressure is applied, the stack 16 is heated, as by an induction furnace (not shown), for example, to a temperature at which the oxide layers 12 and 14 fuse, usually between 1200° C. and 1250° C. for silicon dioxide, for example. Under these conditions of heat and pressure, adjacent oxide layers 12 and 14 of adjacent sheets 10 of the stack 16 fuse, that is, become bonded, to each other in about three minutes and the stack 16 becomes an integral structure. The melting (softening) point of the oxide layers 12 and 14 may be lowered by modifying them with oxides of aluminum, boron, or lead, for example. Thus, the melting (or softening) point of silicon dioxide can be lowered from 1250° C. to about 700° C. by adding lead oxide to it, if desired.

Figure 4:
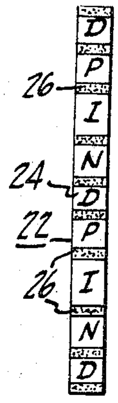
FIG. 4 is an end elevational view of one form of a composite wafer of the present invention.
Figure 5:
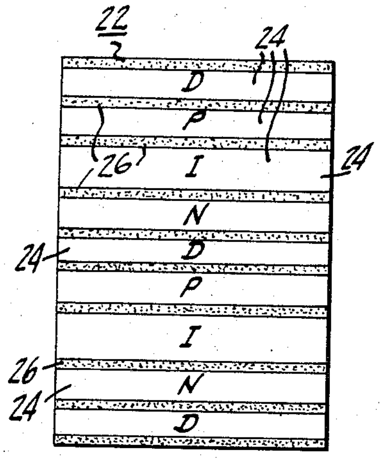
FIG. 5 is a side elevational view of the composite wafer illustrated in FIG. 4.

The stack 16 of fused oxidized sheets 10 is now sliced, preferably by cutting the stack 16 traversely to the surfaces of the oxide layers 12 and 14 to form composite wafers, as shown by the slice 22 in FIGS. 4 and 5, for example. The slice 22 may be one cut by, and included between, the planes indicated by the lines 25 and 27 in FIG. 3, and has new major surfaces disposed transversely to the old. The slice 22 is a composite wafer comprising elongated strips 24 of silicon separated from each other by fused silicon dioxide 26. The strips 24, however, may comprise degenerate silicon, P-type silicon, intrinsic silicon, and N-type silicon, as indicated by the letters D, P, I, and N, respectively, in the drawings. Thus, adjacent strips 24 of the different types of silicon D, P, I, and N are held together by, and separated from each other by, a good electrical insulator, silicon dioxide 26.

Figure 6:
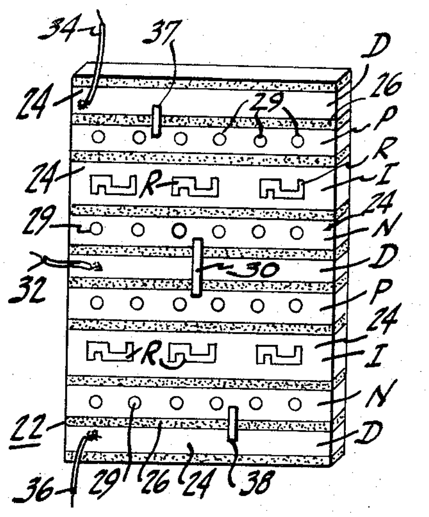
FIG. 6 is a perspective view of the composite wafer illustrated in FIGS. 4 and 5, having, in addition, elements diffused therein, passive components thereon and portions thereof electrically interconnected.

Active electronic components, such as diodes and transistors, for example, may be formed on the exposed surfaces of the strips 24 of the N-type and P-type doped silicon of the slice 22 by any suitable techniques known in the art. Thus, for example, by the techniques described in U.S. Patent 2,802,760, issued to L. Derick, et al., on Aug. 13, 1957, for Oxidation of Semiconductive Surfaces for Controlled Diffusion, a plurality of diodes may be formed in the P-type and N-type strips 24 by diffusing suitable donor or acceptor elements (impurities) from "dots" 29 of such elements into the exposed surfaces of the strips, as illustrated in FIG. 6, for example, in a regular array, many dots to a row. In the strips 24 of N-type material, the elements 29 may be P-type (electron acceptor impurity elements), such as boron. In the P-type strips 24, the elements 29 diffused into the surface may be an N-type impurity, such as phosphorus.

FIG. 6 also illustrates the disposition of passive components, such as a plurality of resistors R, on the strips 24 of intrinsic semiconductor material I. The resistors R may be disposed on the intrinsic strips 24 by any suitable means, as by painting, by printed circuit techniques, or by vapor deposition techniques, all known in the art. However, it is desirable to first oxidize the surface of the intrinsic strip before laying down the resistors to prevent diffusion of the resistor material into the semiconductor. Being on oxidized intrinsic semiconductor material I. the resistors R are well insulated from each other, thereby tending to eliminate spurious leakage currents and capacitive cross-coupling between adjacent components in the slice 22. If the semiconductor material on which the resistor R is formed were other than substantially intrinsic, the parasitic capacitive coupling would be increased, resulting in a condition usually undesirable in most circuits.

FIG. 6 also illustrates how parts of different semiconductor strips 24 may be interconnected and how parts may also be connected to external circuitry or power sources. N-type, P-type and degenerate semiconductor strips 24 may be connected to each other by a conductor 30. The conductor 30 may be applied to these strips 24 by any suitable, known techniques, such as by painting, by printed circuit techniques, or by vapor deposition techniques. An electrical conductor 32 may be bonded, as by a thermal compression bond, to a strip 24 of degenerate material D. Electrical conductors 34 and 36 may also be electrically bonded to the upper and lower degenerate strips 24, respectively, for connections to external circuits (not shown). The upper degenerate strip 24 may be electrically connected to its adjacent P-type strip 24 by a conductor 37; and the lower degenerate strip 24 may be electrically connected to its adjacent N-type strip 24 by an electrical connector 38. The connectors 37 and 38 may be deposited on the slice 22 in the manner described for the connector 30. More reliable electrical connections can usually be made to the strips 24 of degenerate material D by the conductors 32, 34, and 36 than are possible to N-type or P-type semiconductor material because the degenerate semiconductor material D can tolerate micro-cracks without affecting its electrical properties perceptibly.

Figure 9:
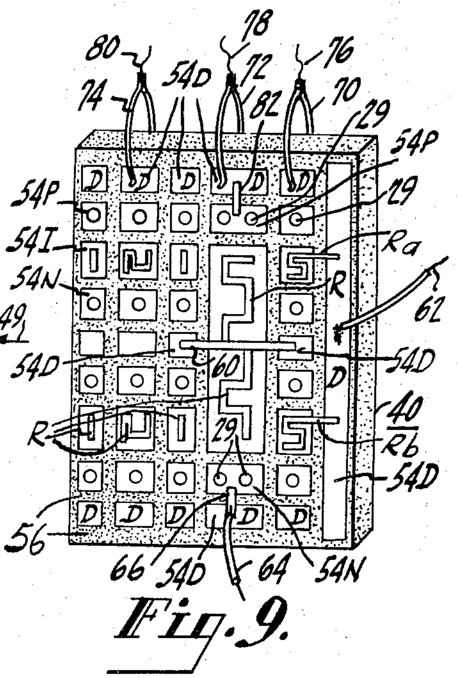
FIG. 9 is a perspective view of a composite wafer in accordance with the present invention obtained by making a slice through the stack of oxidized wafers illustrated in FIG. 8, after adjacent slices in the latter stack have been fused to each other.

A somewhat checkerboard-like composite wafer 40, such as shown in FIG. 9, may be formed from a stack of fused, oxidized slices 22 of the type shown in FIGS. 4 and 5. The slices 22 of semiconductor material are oxidized by any known means, as by heating them in steam at a temperature between 1200° C. to 1250° C., until oxide layers 44 and 46 formed on the opposed major surfaces, respectively, of each slice 22 have a desired thickness. The slices 22 need not have the same number of strips 24, nor need they be of the same thickness or of the same type of semiconductor material. For example, as in the case where a long resistor is to be included in a circuit, an extra thick strip 24*a* of intrinsic material can be included in the stack.

Figures 7, 8:
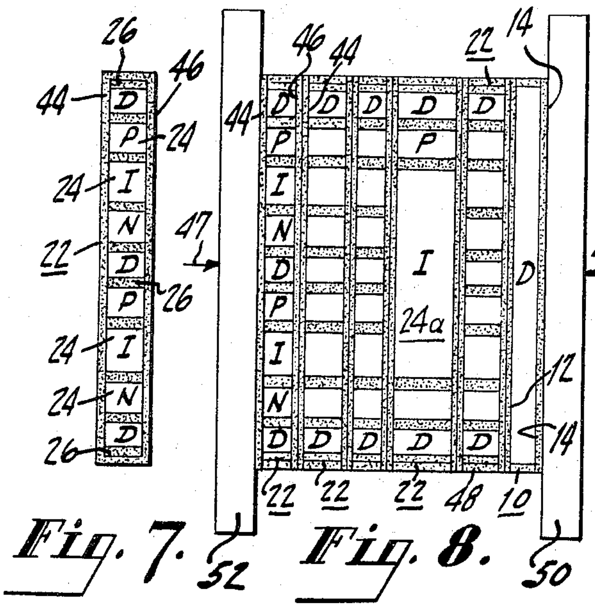
FIG. 7 is an end elevational view of an oxidized wafer of the type illustrated in FIGS. 4 and 5.
FIG. 8 is a stack of oxidized wafers, including modifications of the type illustrated in FIG. 7, under pressure during one of the steps in the method of making another form of wafer of the present invention.

A plurality of oxidized slices 22 are superimposed on each other with the oxide layer 44 of one slice 22 adjacent to the oxide layer 46 of an adjacent slice 22 to form a stack 48, as shown in FIG. 8. The number of slices in the stack 48, as well as the number of strips 24 in each slice and the thickness of each slice, is a matter of choice, depending upon the configuration of the composite wafer 40 desired. If desired, one or more oxidized sheets 10 may be included among the slices 22 in the stack 48, as shown in FIGS. 8 and 9. The stack 48 is disposed between graphite blocks 50 and 52 so that it may be compressed in a press with a pressure of about 1 ton per square inch in directions normal to the major surfaces, as indicated by the arrows 47 and 49. The stack 48 is heated to a temperature between 1200° C. and 1250° C. while under pressure until the oxide layers 44 and 46 soften so that adjacent oxidized slices 22 become fused to each other, whereby the stack 48 becomes an integral structure.

The stack 48 is now sliced transversely to (preferably normal to) the oxide layers 44 and 46 to form a plurality of somewhat checkerboard-like composite wafers 40 wherein discrete pieces 54D, 54I, 54N, and 54P of silicon degenerate, intrinsic, N-type, and P-type semiconductor material, respectively, are separated from each other by fused silicon dioxide 56, and the new major surfaces are transverse to those formed by the first slices 22. Suitable donor or acceptor elements 29 may be diffused into the pieces 54N and 54P of the N-type and P-type semiconductor material, respectively, as by the techniques described in the aforementioned patent. Passive components, such as resistors R, may be disposed on surface-oxidized pieces 54I of intrinsic semiconductor material by any of the aforementioned techniques. Portions of certain resistors R, such as R*a* and R*b*, may be extended to pieces 54D of degenerate semiconductor material to make an electrical connection with the latter. A portion of the large resistor R, centrally located on the wafer 40, as shown in FIG. 9, can be tapped by means of a conductor 60. The conductor 60 extends from one piece 54D of degenerate semiconductor material to another piece 54D of degenerate semiconductor material, making contact with the resistor R intermediate its ends. An electrical conductor 62, such as a relatively heavy wire, may be bonded to a piece 54D of degenerate semiconductor material D. Similarly, an electrical conductor 64 may also be bonded to another piece 54D of degenerate semiconductor material D, which, in turn, may be connected to a piece 54N of N-type semiconductor material, by means of any known techniques including a painted conductor 66, the latter piece 54N having two elements 29 diffused therein.

Figure 10:
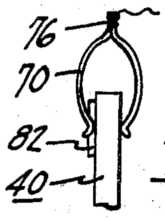
FIG. 10 is a fragmentary, side elevational view of the composite wafer shown in FIG. 9, illustrating connecting means for connecting the wafer to an external circuit.

Referring, now, particularly to FIGS. 9 and 10, there are shown interconnecting means in the form of spring loaded connectors 70, 72, 74, engaging the wafer 40 electrically at the sites of linearly aligned pieces 54D of degenerate semiconductor material. The spring loaded connectors 70, 72, and 74 may be in the form of spring loaded clips, having electrically connected thereto leads 76, 78, and 80, respectively, for connecting circuitry on the wafer 40 to an external circuit. Since the degenerate semiconductor material 54D may be arranged in a linear alignment, as in the top and bottom rows of semiconductor material D shown in the wafer 40, as viewed in FIG. 9, or in the form of a large solid slab, as shown by the piece 54D on the right side of the wafer 40, the wafer 40 may be plugged into many types of spring loaded interconnecting means known in the art. As stated above, the pieces of degenerate semiconductor material D can be connected to active or passive components by any of the aforementioned techniques. Thus, the connector 72 may engage a semiconductor piece 54D which, in turn, can be connected to an adjacent semiconductor piece 54P by means of an electrical connector 82. In connecting the electrical leads 62 and 64 to degenerate semiconductor material 54D by thermal compression bonds, there is less chance of damaging the circuitry and/or components on the wafer 40 than if these thermal compression bonds were made directly to N-type and P-type pieces 54N and 54P, respectively.

In FIG. 11 of the drawing, there is shown a schematic diagram of an MOS (metal oxide semiconductor) transistor 84 in a simple amplifier circuit. The drain electrode DR of the transistor 84 is connected directly to an output terminal 86 and to a voltage terminal 88 through a resistor 90, and the source electrode S of the transistor 84 is connected to a voltage terminal 92. The gate G of the transistor 84 is connected to an input terminal 94.

The active and passive components of the amplifier circuit, illustrated schematically in FIG. 11, are shown disposed and interconnected on a composite wafer 96 (FIG. 12). The composite wafer 96 is made from two composite slices 98 and 104 of semiconductor material. The composite slice 98 comprises a piece 100N of N-type semiconductor material, such as N-type silicon, and a piece 102I of substantially intrinsic semiconductor material, such as intrinsic silicon. The composite slice of the wafer 96 comprises four pieces 106D, 108D, 110D, and 112D of degenerate semiconductor material, such as degenerate silicon. The discrete pieces of semiconductor material in the composite wafer 96 are bonded together by fused silicon dioxide 114 which functions also to insulate them electrically.

The reference characters that designate the symbols of the components of the schematic diagram in FIG. 11 are also used in FIG. 12 to designate the actual components on the composite wafer 96. Thus, referring to FIG. 12, the MOS transistor 84 is formed in the piece 100N of N-type silicon by any known procedure in the art, such as, for example, that taught by Hofstein and Heiman, "The Silicon Insulated Gate Field-Effect Transistor," Proc. IEEE, vol. 51, p. 1190, September, 1963. The drain electrode DR of the transistor 84 is connected to one end of the resistor 90, the latter being disposed on the piece 102I. The other end of the resistor 90 is electrically connected to the piece 112D of degenerate semiconductor material by any suitable means known in the art. The voltage terminal 88, in FIG. 12, indicated as an electrical conductor, is connected to the piece 112D by any suitable means, as by a thermal compression bond.

The gate G of MOS transistor 84 is electrically insulated from the piece 100N of N-type semiconductor material by a layer 101 of silicon dioxide, but is electrically connected to the piece 110D of degenerate semiconductor material. The input terminal 94, in the form of an electrical conductor, is connected to the piece 110D by a thermal compression bond to make a good electrical connection therewith. The source electrode S of the transistor 84 is connected to the voltage terminal 92, in FIG. 12, by means of the piece 108D of degenerate semiconductor material, the electrode S being connected to the piece 108D, by any suitable means, and the terminal 92 being connected to the piece 108D by a thermal compression bond. While only one amplifier circuit is shown on the composite wafer 96, in FIG. 12, a plurality of such circuits may be placed on a single wafer that has a multiplicity of the pieces of the semiconductor material of the wafer 96.

From the foregoing description, it will be apparent that there have been provided improved, composite semiconductor wafers. While only a few embodiments of the invention have been described, variations in the structure of the composite wafers, all coming within the spirit of this invention, will, no doubt, readily suggest themselves to those skilled in the art. Hence, it is desired that the foregoing description shall be considered as illustrative and not in a limiting sense.

What is claimed is:

1. A composite wafer comprising
(a) a plurality of pieces of silicon, at least one of said pieces being of a material selected from the group consisting of intrinsic semiconductor material and degenerate semiconductor material,
(b) portions of each of said pieces being oxidized to silicon dioxide, and
(c) said pieces being joined to each other in said wafer by said silicon dioxide, at least one of said pieces having an unoxided surface forming a part of a surface of said wafer.

2. A composite wafer comprising
(a) a plurality of pieces of silicon, at least one of said pieces being of a material selected from the group consisting of intrinsic semiconductor material and degenerate semiconductor material,
(b) portions of each of said pieces being coated with silicon-dioxide,
(c) said pieces being joined to each other in said wafer by said silicon dioxide, at least one of said pieces having an unoxided surface forming a part of a major surface of said wafer, and
(d) at least one activecomponent formed in said unoxided surface of said one piece.

References Cited

UNITED STATES PATENTS

| | | | |
|---|---|---|---|
| 2,786,166 | 3/1957 | Poganski | 317—234 |
| 3,136,897 | 6/1964 | Kaufman. | |
| 3,153,731 | 10/1964 | Shombert | 307—88.5 |
| 3,178,804 | 4/1965 | Ullery et al. | |
| 3,220,896 | 11/1965 | Miller | 317—235 XR |
| 3,235,428 | 2/1966 | Naymik. | |

ROBERT S. MACON, *Primary Examiner.*

ROBERT K. SCHAEFER, KATHLEEN H. CLAFFY, MAX L. LEVY, *Examiners.*

W. C. GARVERT, D. SMITH, Jr., *Assistant Examiners.*